United States Patent [19]

Horie

[11] 4,030,954

[45] June 21, 1977

[54] METHOD OF MANUFACTURING A SEMICONDUCTOR INTEGRATED CIRCUIT DEVICE

[75] Inventor: Noboru Horie, Kodaira, Japan

[73] Assignee: Hitachi, Ltd., Japan

[22] Filed: Sept. 30, 1975

[21] Appl. No.: 617,991

[30] Foreign Application Priority Data

Sept. 30, 1974 Japan .............................. 49-111472

[52] U.S. Cl. ............................... 156/628; 148/187; 156/657; 156/659; 357/36
[51] Int. Cl.² .......................................... H01L 7/50
[58] Field of Search ............... 156/17; 148/1.5, 187, 148/190; 29/580; 357/34, 35, 36, 91

[56] References Cited

UNITED STATES PATENTS

| | | | |
|---|---|---|---|
| 3,808,058 | 4/1974 | Henning | 156/17 X |
| 3,891,469 | 6/1975 | Moriyama et al. | 148/187 X |

*Primary Examiner*—William A. Powell
*Attorney, Agent, or Firm*—Craig & Antonelli

[57] ABSTRACT

A method of manufacturing a semiconductor integrated circuit device including N-P-N transistors is characterized in that a base region of at least one of the N-P-N transistors is partially etched and removed with chemicals, thus to be formed with a depression, and that an emitter region opposite in the conductivity type to the base region is formed in the base region beneath the depression, whereby the at least one N-P-N transistor is made higher in the current gain $h_{FE}$ than the other N-P-N transistors being the main constituents of the integrated circuit device.

8 Claims, 4 Drawing Figures

METHOD OF MANUFACTURING A SEMICONDUCTOR INTEGRATED CIRCUIT DEVICE

FIELD OF THE INVENTION

This invention relates to a method of manufacturing a semiconductor integrated circuit device (IC).

BACKGROUND OF THE INVENTION

In designing a circuit, it is often desired that some of N-P-N transistors included in a bipolar type IC can be used as N-P-N transistors of high current gain ($h_{FE}$). In case of manufacturing an IC including such N-P-N transistor higher in $h_{FE}$ than the main constituent N-P-N transistors, it has heretofore been a particle that, while the manufacture of the main constituent N-P-N transistors is carried out, a P-type diffused layer for the base (or an N-type diffused layer for the emitter) of the high $h_{FE}$ N-P-N transistor is formed by a mask diffusion step separate from that for P-type diffused layers for the bases (or N-type diffused layers for the emitters) of the main constituent N-P-N transistors of the main constitutent N-P-N transistors, in order to make the base width of the high $h_{FE}$ N-P-N transistor small.

Due to the increased mask diffusion steps, however, the method of manufacturing the IC involves such disadvantages that the manufacturing process becomes complicated and that the characteristics of other elements within the IC are degraded.

SUMMARY OF THE INVENTION

It is therefore an object of this invention to provide a method of simply and easily manufacturing an IC which includes at least one N-P-N transistor having a higher $h_{FE}$ than the main constituent N-P-N transistors.

BRIEF DESCRIPTION OF THE INVENTION

The fundamental construction of this invention for accomplishing such an object resides, in an IC including two or more N-P-N transistors, in a method of manufacturing an IC characterized in that a base region of at least one of the N-P-N transistors is partially etched and chemically removed, to form a concave portion, and that an emitter region, of an opposite conductivity type relative to the base region, is formed in the base region beneath the concave portion.

DETAILED DESCRIPTION OF THE INVENTION

Figure 1:
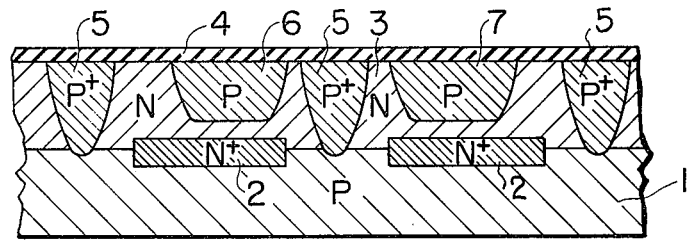
FIGS. 1-4 are sectional views which illustrate the method of manufacturing the IC according to the invention.

In FIGS. 1 through 4 numeral 1 designates a P-type Si substrate, numeral 2 an N$^+$ -type buried layer, numeral 3 an N-type epitaxial layer, numeral 4 an SiO$_2$ film, numeral 5 a P$^+$ -type isolating layer, numerals 6 and 7 P-type diffused layers, numerals 8, 9, 10 and 11 N$^+$-type diffused layers, letter B a base electrode, letter C a collector electrode, and letter E an emitter electrode.

As is shown in FIG. 1, the N$^+$-type buried layers 2 are formed at selected areas on the P-type Si substrate 1, the N-type epitaxial layer 3 is formed thereon, and the P$^+$-type isolating layers 5 are thereafter formed by mask diffusion in which the SiO$_2$ film 4 on the N-type epitaxial layer 3 is used as a mask. Subsequently, the P-type diffused layer 6 for a base is formed in that portion of the N-type epitaxial layer 3 isolated by the P$^+$-type isolating layers 5 in which an N-P-N transistor is to be formed, and simultaneously therewith, the P-type diffused layer 7 is formed in the portion of the N-type epitaxial layer 3 in which an N-P-N transistor of a higher $h_{FE}$ than the first-mentioned N-P-N transistor is to be formed. Hereinbelow, for convenience' sake, the N-P-N transistor the base of which is the P-type diffused layer 6 shall be termed the first N-P-N transistor, while the N-P-N transistor the base of which is the P-type diffused layer 7 shall be called the second N-P-N transistor. Accordingly, the first N-P-N transistor is the N-P-N transistor as the main constituent in the IC of the present embodiment, and the second N-P-N transistor is the N-P-N transistor of a higher $h_{FE}$ than the first N-P-N transistor.

Figure 2:
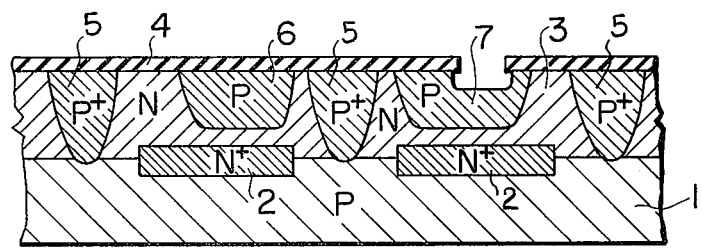

Next, as is shown in FIG. 2, a predetermined opening is formed by photoetching in the SiO$_2$ film 4 on the P-type diffused layer 7 for the base of the second N-P-N transistor, and, using the SiO$_2$ film 4 as a mask, a concave portion is selectively formed at a part of the P-type diffused layer 7 by chemical etching (for example, a mixed solution consisting of HF and HNO$_3$, a mixed solution consisting of HF, HNO$_3$ and CH$_3$COOH, or the like may be used).

Figure 3:
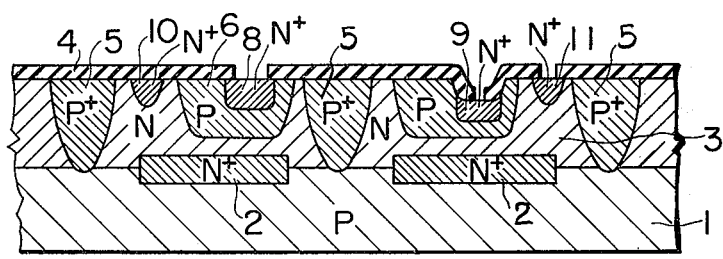
Figure 4:
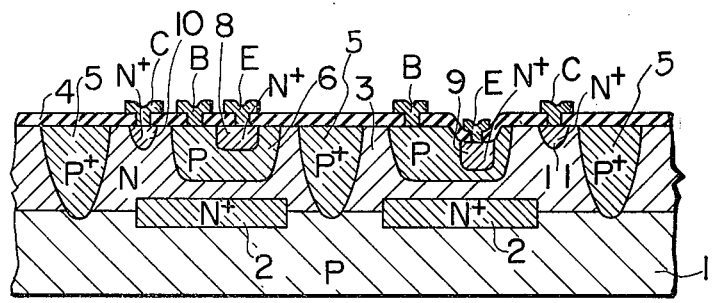

Next, as is shown in FIG. 3, the N$^+$-type diffused layers 8 and 9 for emitters and the N$^+$-type diffused layers 10 and 11 for the collector electrodes are formed by mask diffusion at the same time. Thereafter, as is shown in FIG. 4, the electrodes of the respective elements are formed by the evaporation of A 1 and photoetching techniques.

The second N-P-N transistor in the IC including the first N-P-N transistor as the main constituent and formed by the above described method of manufacturing the IC has the N$^+$-type diffused layer 9 for its emitter formed in the region with the upper part of the P-type diffused layer 7 for its base etched and removed to form a depression. The base width of the second N-P-N transistor is therefore extremely small, so that its current gain $h_{FE}$ becomes higher in comparison with that of the first N-P-N transistor.

When compared with the prior-art method of manufacturing an IC of this kind, the present invention decreases the number of mask diffusion steps and the number of photoresist steps. Therefore, the process becomes simple and easy, and the yield of manufacture is consequently enhanced.

This invention is not restricted to the foregoing embodiment, but it is applicable to a method of manufacturing integrated circuits in a variety of aspects.

I claim:

1. In a method of manufacturing at least two transistors, having current gains different from each other, in a semiconductor integrated circuit, the improvement comprising the steps of
   a. providing a semiconductor substrate having at least first and second collector regions each having a first conductivity type, electrically isolated from each other, respectively extending to a principal surface of the semiconductor substrate,
   b. diffusing an impurity of a second conductivity type, opposite to said first conductivity type, at the same time in said first and second collector regions, from said principal surface, to form first and second base regions in said first and second collector regions, respectively, c. partially removing a surface portion of said first base region to form a depression therein, and d. diffusing an impurity of said first conductivity type in said first base region beneath said depression and said second region from said principal surface, to form emitter regions therein, respectively.

2. The improvement according to claim 1, wherein said step of removing comprises the step of selectively etching said surface portion of said first base region.

3. The improvement according to claim 1, wherein said step of selectively etching comprises selectively masking the surface of the said first base region and chemically etching the surface of said first base region.

4. A method of manufacturing a semiconductor integrated circuit device having first and second transistors with differing current gains comprising the steps of:

a. forming first and second base regions of semiconductor material of a first conductivity type in separated and electrically isolated collector regions of a semiconductor substrate of a second conductivity type, opposite said first conductivity type, so that said base regions extend to a first principal surface of said substrate in which said collector regions are respectively provided;

b. partially removing semiconductor material from a selected surface portion of said first base region to form a depression therein;

c. forming a first emitter region of semiconductor material of said second conductivity type in a selected portion of said first base region beneath the depression therein; and d. forming a second emitter region of semiconductor material of said second conductivity type in a selected portion of said second base region.

5. A method according to claim 4, wherein steps (c) and (d) are carried out simultaneously.

6. A method according to claim 4, wherein steps (c) and (d) include the simultaneous introduction of impurities of said second conductivity type into the selected portions of said first and second base regions.

7. A method according to claim 6, wherein step (b) comprises selectively etching said first base region to a prescribed depth beneath said selected surface portion thereof to thereby reduce the base width of said first transistor as compared to that of said second transistor, whereby the current gain of said first transistor exceeds that of said second transistor.

8. A method according to claim 7, wherein said step of selectively etching comprises selectively masking the surface of the said first base region and chemically etching the surface of said first base region.

* * * * *